US011924989B2

(12) United States Patent
Shih (10) Patent No.: US 11,924,989 B2
(45) Date of Patent: Mar. 5, 2024

(54) FIXING DEVICE

(71) Applicants: Inventec (Pudong) Technology Corporation, Shanghai (CN); INVENTEC CORPORATION, Taipei (TW)

(72) Inventor: Ming Hung Shih, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 17/931,137

(22) Filed: Sep. 12, 2022

(65) Prior Publication Data
US 2023/0284408 A1   Sep. 7, 2023

(30) Foreign Application Priority Data

Mar. 7, 2022   (CN) .......................... 202210216321.X (51) Int. Cl.
*H05K 5/00*   (2006.01)
*H05K 5/03*   (2006.01)

(52) U.S. Cl.
CPC .............. *H05K 5/03* (2013.01); *H05K 5/0056* (2013.01)

(58) Field of Classification Search
CPC ...... H05K 5/03; H05K 5/0017; H05K 5/0056; H05K 5/0217

USPC ....... 361/760, 728, 752, 761, 796, 800, 807, 361/809, 810
See application file for complete search history.

(56) References Cited

U.S. PATENT DOCUMENTS

| | | | | |
|---|---|---|---|---|
| 2002/0172022 | A1* | 11/2002 | DiBene, II ......... | H01R 12/7088 257/E23.09 |
| 2003/0057548 | A1* | 3/2003 | Hartke .................... | H01R 4/64 257/718 |
| 2005/0265001 | A1* | 12/2005 | Saito ................... | H01L 23/4006 257/E23.084 |
| 2015/0327353 | A1* | 11/2015 | Dickover ............ | H01L 23/4338 29/890.03 |

* cited by examiner

*Primary Examiner* — Hung S. Bui
(74) *Attorney, Agent, or Firm* — CKC & Partners Co., LLC (57) ABSTRACT

A fixing device includes a circuit board, a first cover, a reinforcing piece, and a double-layer chip. The circuit board has a first surface and a second surface opposite to each other. The first cover is disposed adjacent to the first surface and has a first bump which has a first abutting surface facing the first surface. The reinforcing piece is located on the first surface and adjacent to the first bump. The double-layer chip has an upper layer and a lower layer which are electrically connected. An upper surface of the upper layer and a lower surface of the lower layer are respectively located on opposite sides of the double-layer chip, and an area of the upper surface is smaller than an area of the lower surface. The lower layer of the double-layer chip and the second surface of the circuit board are electrically connected.

8 Claims, 7 Drawing Sheets

FIXING DEVICE

CROSS-REFERENCE TO RELATED APPLICATION

This application claims priority to China Application Serial Number 202210216321.X, filed Mar. 7, 2022, which is herein incorporated by reference in its entirety.

BACKGROUND

Field of Invention

The present invention relates to a fixing device.

Description of Related Art

The automatic driving technology of electric vehicles in the future may be realized through 5G network techniques. The artificial intelligence box (AI box) of a 5G network may be installed in different environments, and thus interacts and communicates with electric vehicles through 5G signals. The central processing unit (CPU) of the 5G AI box needs to utilize two-sided heat dissipation to maintain normal operation. Typically, a heat dissipation plate may be installed on the housing of the 5G AI box, and heat may be dissipated through conduction between the housing and the CPU. However, the area of the upper surface and the lower surface of the CPU is different. If the housing contacts two sides of the CPU, it may cause uneven forces to be exerted on the CPU, and may result in cracks or deformations.

SUMMARY

An aspect of the present disclosure is related to a fixing device.

According to one embodiment of the present disclosure, a fixing device includes a circuit board, a first cover, a reinforcing piece, and a double-layer chip. The circuit board has a first surface and a second surface opposite to each other. The first cover is located adjacent to the first surface. The first cover has a first bump. The first bump has a first abutting surface facing the first surface. The reinforcing piece is located on the first surface and adjacent to the first bump. The double-layer chip has an upper layer and a lower layer. The upper layer and the lower layer are electrically connected. An upper surface of the upper layer and a lower surface of the lower layer are respectively located on opposite sides of the double-layer chip, and an area of the upper surface is smaller than an area of the lower surface. The lower layer of the double-layer chip is electrically connected to the second surface of the circuit board.

In an embodiment of the present disclosure, the reinforcing piece is fully attached on the first surface.

In an embodiment of the present disclosure, the reinforcing piece includes two fixing portions that contact and fix to the first surface. The first bump is located between the two fixing portions of the reinforcing piece.

In an embodiment of the present disclosure, the circuit board further includes an opening that penetrates through the first surface and the second surface. The opening corresponds in location to the first bump, and the upper layer of the double-layer chip is embedded into the opening.

In an embodiment of the present disclosure, the reinforcing piece is a closed frame that surrounds the opening.

In an embodiment of the present disclosure, a projection of the first abutting surface along a direction that is perpendicular to the first surface passes through the opening and is located inside the inner edge of the opening.

In an embodiment of the present disclosure, the first abutting surface partially protrudes into the opening, and contacts the upper layer of the double-layer chip.

In an embodiment of the present disclosure, the fixing device further includes a second cover. The circuit board is located between the first cover and the second cover. The second cover includes a second bump. The second bump has a second abutting surface that corresponds in location to the opening, and contacts the lower layer of the double-layer chip.

In an embodiment of the present disclosure, the reinforcing piece includes fixing portions. At least one of the fixing portions is fixed to the first cover, and at least another one of the fixing portions is fixed to the second cover.

In an embodiment of the present disclosure, the first bump and the second bump comprise thermal conductive material.

In conclusion, in the fixing device of the present disclosure, the reinforcing piece on the surface of the circuit board, which is located between the first cover and the second cover, improves the equal distribution of force that applies from different directions. The reinforcing piece further strengthens the area that surrounds the opening of the circuit board, and disperses the force applied around the opening. Moreover, together with the first bump and the second bump, the reinforcing piece separates the force applied to the chip contained inside the opening to two opposite sides of the chip. Therefore, the circuit board or the electrical components or chips on the circuit board are prevented from being cracked or deformed by the force. In addition, the fixing device further solves the heat dissipation problem of the circuit board by conducting the heat to the cooling fins by the first bump and the second bump.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Spatially relative terms, such as "beneath," "below," "lower," "above," "upper," "front," "back" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
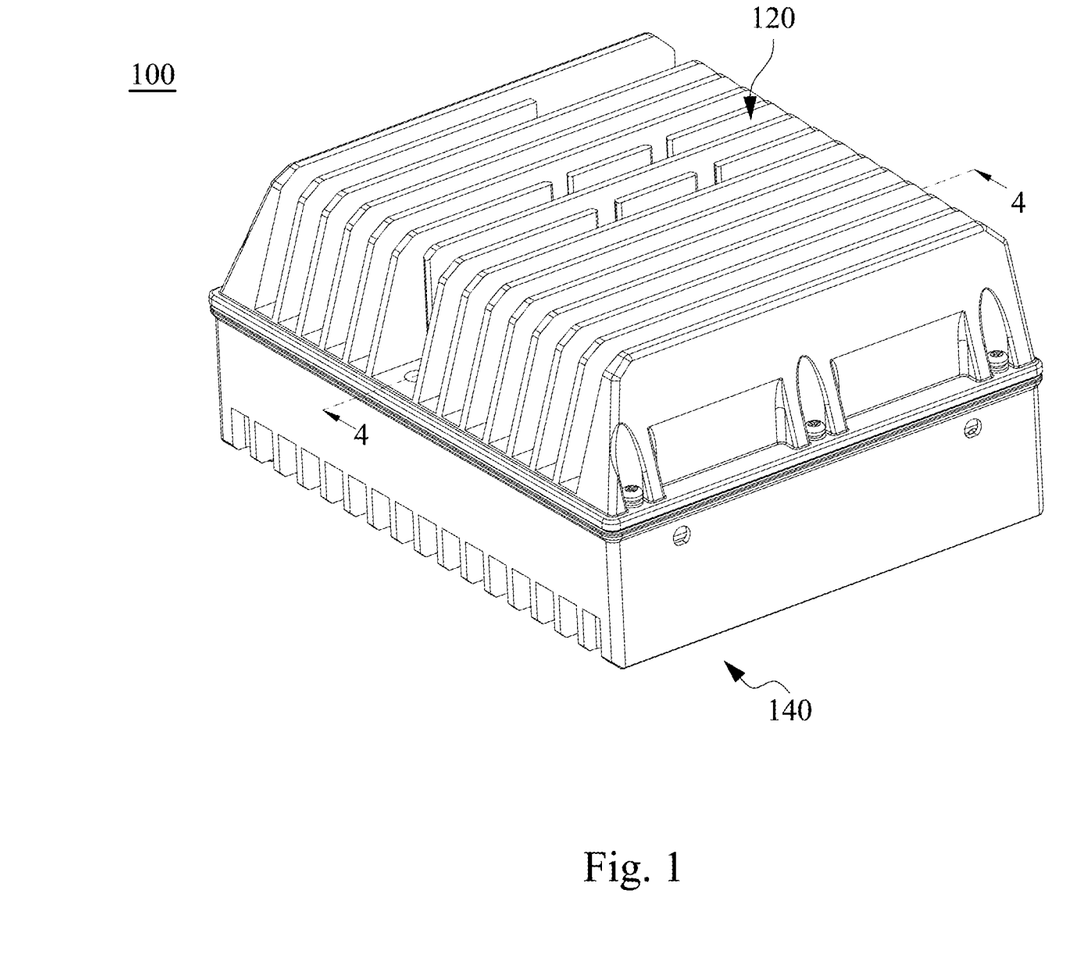
FIG. 1 schematically illustrates a fixing device, according to some embodiments of the present disclosure.
Figure 2A:
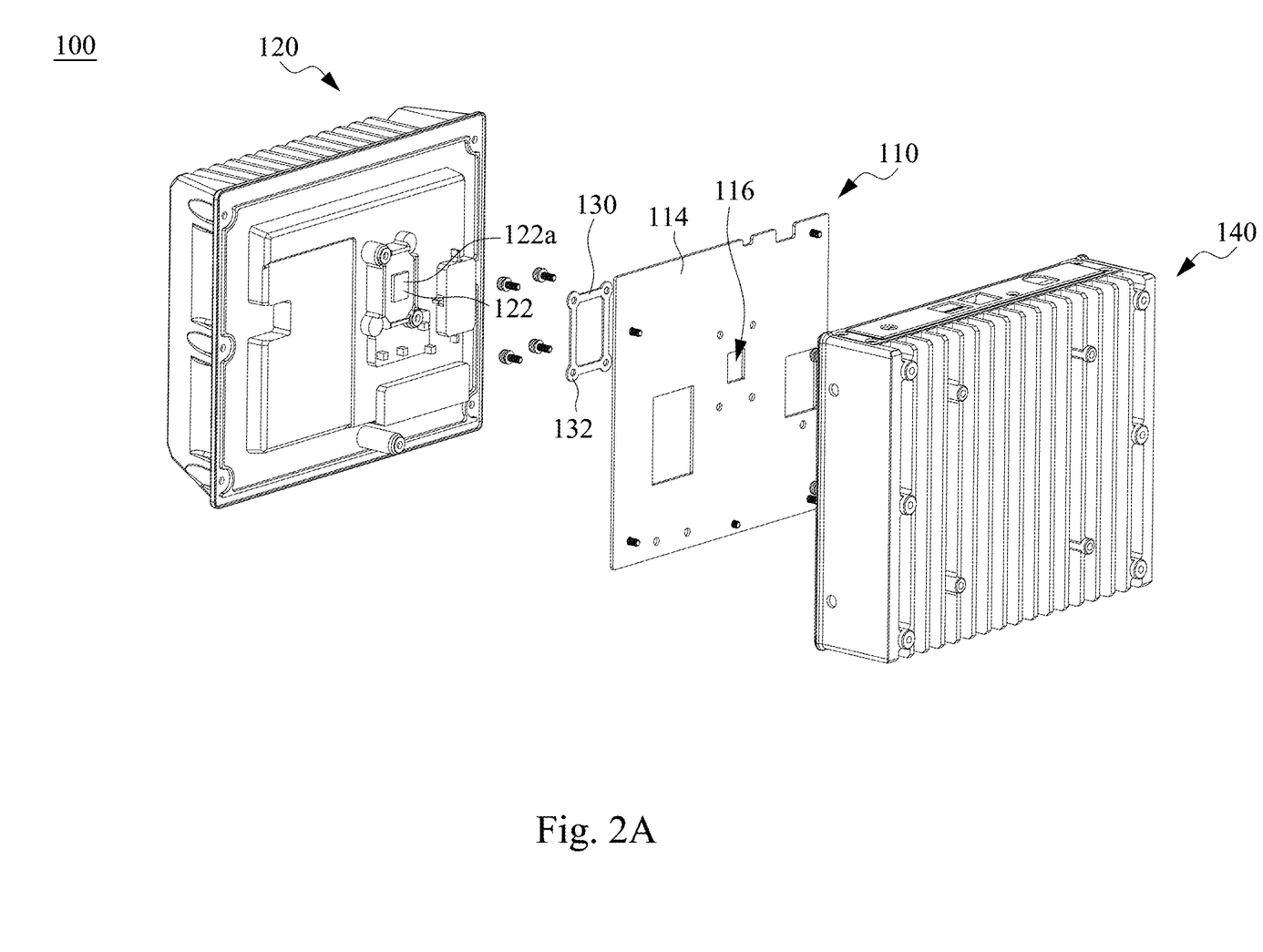
FIG. 2A schematically illustrates an exploded diagram of the fixing device, according to some embodiments of the present disclosure.
Figure 2B:
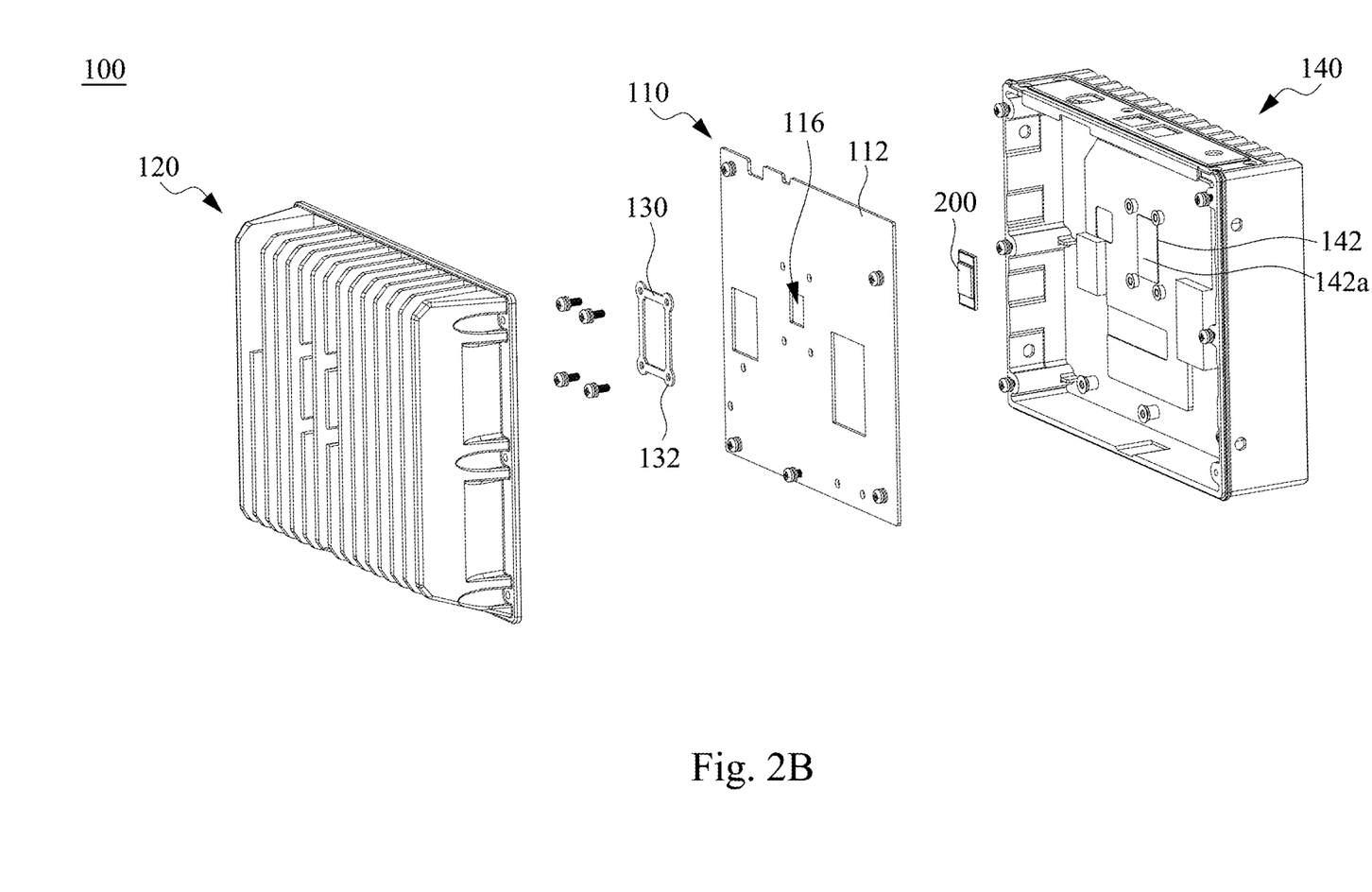
FIG. 2B schematically illustrates an exploded diagram of the fixing device in another view, according to some embodiments of the present disclosure.
Figure 2C:
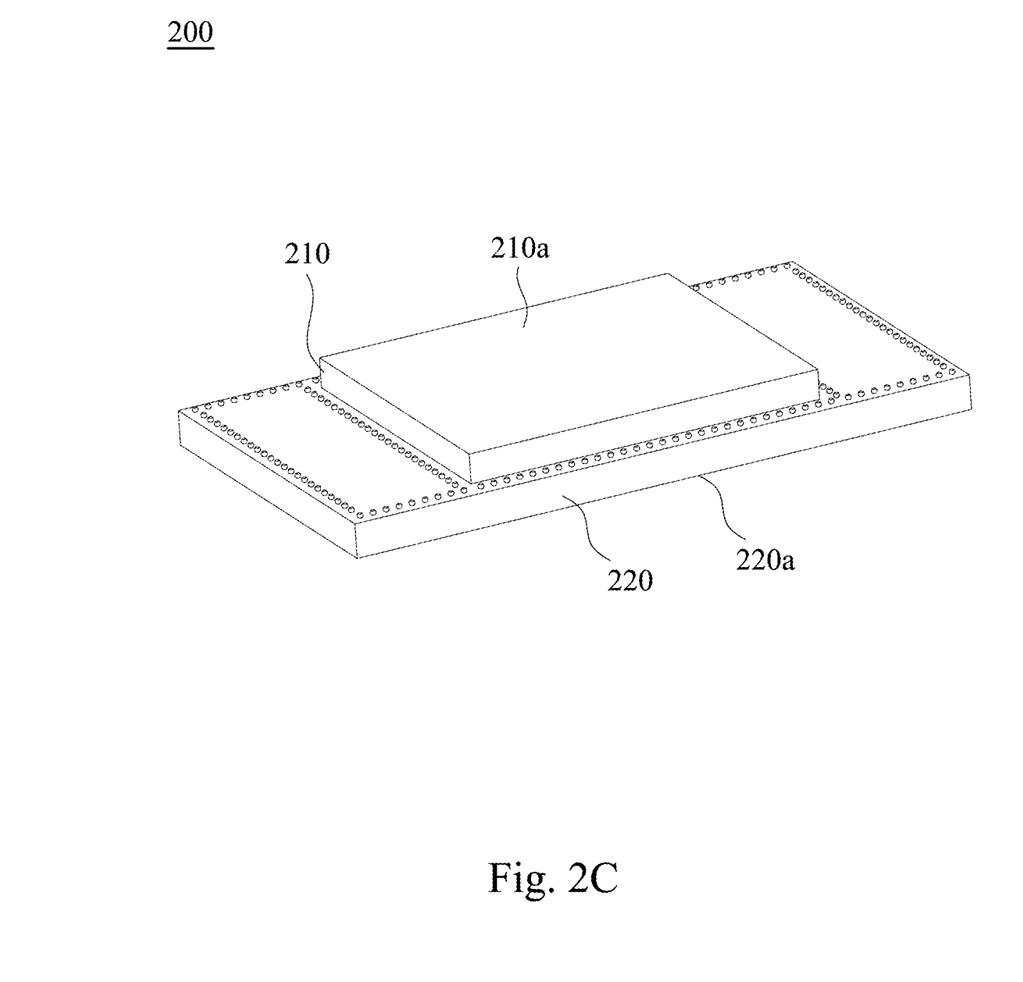
FIG. 2C schematically illustrates a double-layer chip of the fixing device, according to some embodiments of the present disclosure.

FIG. 1 schematically illustrates a fixing device 100, according to some embodiments of the present disclosure. FIG. 2A schematically illustrates an exploded diagram of the fixing device 100, according to some embodiments of the present disclosure. FIG. 2B schematically illustrates an exploded diagram of the fixing device in another view, according to some embodiments of the present disclosure. FIG. 2C schematically illustrates a double-layer chip of the fixing device 100, according to some embodiments of the present disclosure. Referring to FIGS. 1, 2A, 2B and 2C, the fixing device 100 of the present disclosure includes a circuit board 110, a first cover 120, a reinforcing piece 130, and a double-layer chip 200. The circuit board 110 has a first surface 112 and a second surface 114 opposite to each other. The first cover 120 is located adjacent to the first surface 112. The first cover 120 has a first bump 122. The first bump 122 has a first abutting surface 122a facing the first surface 112. The reinforcing piece 130 is located on the first surface 112 and adjacent to the first bump 122. The double-layer chip 200 is located on the circuit board 110. The double-layer chip 200 has an upper layer 210 and a lower layer 220. The upper layer 210 and the lower layer 220 are electrically connected. An upper surface 210a of the upper layer 210 and a lower surface 220a of the lower layer 220 are respectively located on opposite sides of the double-layer chip 200, and an area of the upper surface 210a is smaller than an area of the lower surface 220a. The upper layer 210 and the lower layer 220 of the double-layer chip 200 are electrically connected through solder balls (not shown). The lower layer 220 of the double-layer chip 200 is electrically connected to the second surface 114 of the circuit board 110.

The first surface 112 of the circuit board 110 has multiple electronic components and chips, for example, central processing unit (CPU) chips with ball grid array (BGA). In the following paragraphs, an embodiment of a BGA chip as the double-layer chip 200 will be described. The multiple electronic components and chips are covered by the first cover 120. In some embodiments, the circuit board 110 further includes an opening 116 that penetrates through the first surface 112 and the second surface 114. The opening 116 corresponds in location to the first bump 122, and the upper layer 210 of the double-layer chip 200 is embedded into the opening 116. Specifically, in some embodiments, the opening 116 may contain electronic components or chips, for example, the double-layer chip 200. As stated above, the double-layer chip 200 has a double-layer structure with the upper layer 210 and the lower layer 220. The upper layer 210 and the lower layer 220 are welded by BGA, and a surface area of the upper layer 210 is smaller than a surface area of the lower layer 220. For example, in a view along a direction which is perpendicular to the first surface 112, the upper layer 210 has a square-like surface area (e.g., the area of the upper surface 210a), and the lower layer 220 has a rectangular surface area (e.g., the area of the lower surface 220a). The rectangular surface area of the lower layer 220 is larger than the square-like surface area of the upper layer 210. Moreover, the lower layer 220 and the upper layer 210 of the double-layer chip 200 are connected through a joint surface, and areas of the lower layer 220 which are not covered by the joint surface have an array of multiple solder balls. Referring to the embodiment shown in FIG. 2A and FIG. 2B, the size of the opening 116 allows the upper layer 210 of the double-layer chip 200 to protrude inside the opening 116, whereas the lower layer 220 of the double-layer chip 200 will be positionally limited at a side of the circuit board 110 (for example, positionally limited at the second surface 114 of the circuit board 110.) The double-layer chip 200 may be electrically connected to the second surface 114 of the circuit board 110 by the solder balls on the lower layer 220.

The first cover 120 is located adjacent to a side of the first surface 112. In some embodiments, the first cover 120 may have multiple heat dissipation structures, such as cooling fins, on a side of the first cover 120 which is away from the first surface 112. These heat dissipation structures may improve the dissipation efficiency of the circuit board 110 and maintain the normal operation of the circuit. The first cover 120 may conduct heat to the cooling fins through direct contact with a heat source (for example, the heating components or chips on the circuit board 110) to thereby cool down the first cover 120 through the cooling fins.

The first bump 122 protrudes from the first cover 120 toward the first surface 112. The location of the first bump 122 may correspond to the electronic components or chips on the circuit board 110, and contact at least one of the electronic components or chips. Specifically, a projection of the first abutting surface 122a along a direction that is perpendicular to the first surface 112 passes through the opening 116 and is located inside the inner edge of the opening 116. As mentioned in the preceding paragraphs, the embodiment of a BGA chip is used as the double-layer chip 200, and the first abutting surface 122a of the first bump 122 may correspond to the location of the opening 116 of the circuit board 110. An area of the projection of the first bump 122 along the direction that is perpendicular to the first surface 112 may be smaller than an area of the opening 116. Therefore, in some embodiments, the first abutting surface 122a partially protrudes into the opening 116, and contacts the upper layer 210 of the double-layer chip 200. Specifically, the first bump 122 may extend into the opening 116, and contact the upper surface 210a of the double-layer chip 200 through the first abutting surface 122a. However, the present disclosure is not limited to such a configuration.

Figure 3:
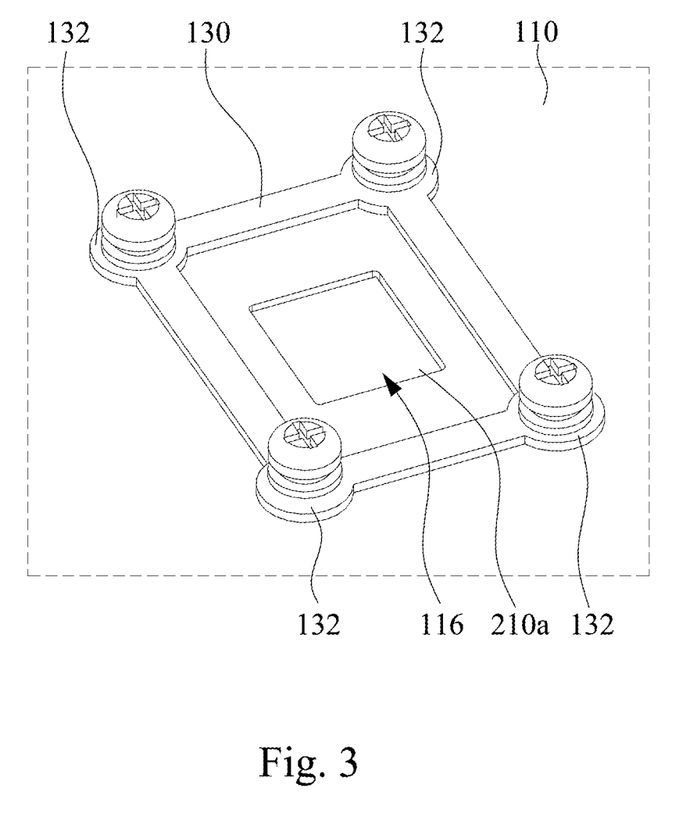
FIG. 3 schematically illustrates an enlarged view of a part of the fixing device, according to some embodiments of the present disclosure.

FIG. 3 schematically illustrates an enlarged view of a part of the fixing device 100, according to some embodiments of the present disclosure. Referring to FIG. 2A, FIG. 2B and FIG. 3, the reinforcing piece 130 is located adjacent to the first bump 122. In some embodiments, the reinforcing piece 130 is fully attached on the first surface 112. However, the present disclosure is not limited to such a configuration. Specifically, as shown in FIG. 3, the reinforcing piece 130 surrounds the opening 116 to equally distribute the force applied around the area nearby the opening 116, and further prevents the circuit board 110 from being bent or deformed, as well as to prevent the components or chips on the circuit board 110 from cracking due to pressing of the outer cover (such as the first cover 120). In greater detail, by preventing the circuit board 110 from being bent or deformed, the cracking of the BGA joint (solder balls) between the upper layer 210 and the lower layer 220 and between the lower layer 220 and the back of the circuit board 110 may also be prevented. By fully attaching (such as by gluing or fixing) the reinforcing piece 130 on the first surface 112, the contact area between the reinforcing piece 130 and the first surface 112 may be maximized, thus optimizing the force distribution and preventing the circuit board 110 from being bent or deformed. In some embodiments, the reinforcing piece 130 is a closed frame that surrounds the opening 116. However, the present disclosure is not limited to such a configuration. Specifically, as shown in FIG. 3, the reinforcing piece 130 is a frame with a rectangular opening. The rectangular opening surrounds the opening 116 and fully exposes the opening 116. However, in other embodiments, the reinforcing piece 130 may be a frame in other shapes. Further, in some other embodiments, the reinforcing piece 130 may be composed of multiple separated or connected parts that contain similar or different shapes.

In some embodiments, the reinforcing piece 130 further includes at least two fixing portions 132 that contact and fix to the first surface 112. The first bump 122 is located between the two fixing portions 132 of the reinforcing piece 130. The fixing portions 132 may be fixed by, for example, screw locking, splicing, welding, etc. Specifically, the fixing portions 132 of the reinforcing piece 130 may be located on any two sides of the reinforcing piece 130 to thereby equally distribute the force to the area covered by the reinforcing piece 130. In FIG. 3, the reinforcing piece 130 is a frame with a rectangular opening, and has two groups of the fixing portions 132 with two of the fixing portions 132 in each group. The first bump 122 is located at the center of the two groups of the fixing portions 132 to optimize the distribution of the force.

Reference is made to FIG. 1, FIG. 2A, FIG. 2B and FIG. 2C. In some embodiments, the fixing device 100 further includes a second cover 140. The circuit board 110 is located between the first cover 120 and the second cover 140. The second cover 140 includes a second bump 142. The second bump 142 has a second abutting surface 142a that corresponds in location to the opening 116, and contacts the lower layer 220 of the double-layer chip 200. Specifically, an accommodation space between the first cover 120 and the second cover 140 may contain the circuit board 110 or other devices or elements. The first cover 120 and the second cover 140 may be fixed through screw locking, splicing, welding, etc. In some embodiments, the second bump 142 of the second cover 140 protrudes toward the second surface 114, and an area of the second abutting surface 142a of the second bump 142 is larger than an area of the opening 116, such that the second bump 142 may fully cover the opening 116. In the embodiment shown in FIG. 2A and FIG. 2B, the area of the second abutting surface 142a is equal to or larger than the lower surface 220a of the lower layer 220 of the double-layer chip 200. The second abutting surface 142a may equally distribute a force applied to the double-layer chip 200 through the lower surface 220a of the double-layer chip 200, and thus stabilize the electrical connection between the double-layer chip 200 and the circuit board 110.

In some embodiments, the second cover 140 may have multiple heat dissipation structures, such as cooling fins, which are similar to or the same as the cooling fins of the first cover 120, thus improving the heat dissipation efficiency of the circuit board 110 and maintaining the normal operation of the circuit. Moreover, in some embodiments, the first bump 122 and the second bump 142 comprise thermal conductive material. For example, the first cover 120 and the second cover 140 may made by a thermal conductor, and the first cover 120 and the second cover 140 may contact the heat source (e.g., the double-layer chip 200) through the first bump 122 and the second bump 142 respectively, and conduct the heat to the cooling fins to achieve heat dissipation. However, the present disclosure is not limited to such a configuration. In other embodiments, the thermal conductivity may only exist in certain areas on the first bump 122 and the second bump 142, and such a structure may control the conduction path on the first bump 122 and the second bump 142 and assist the heat dissipation process.

Figure 4A:
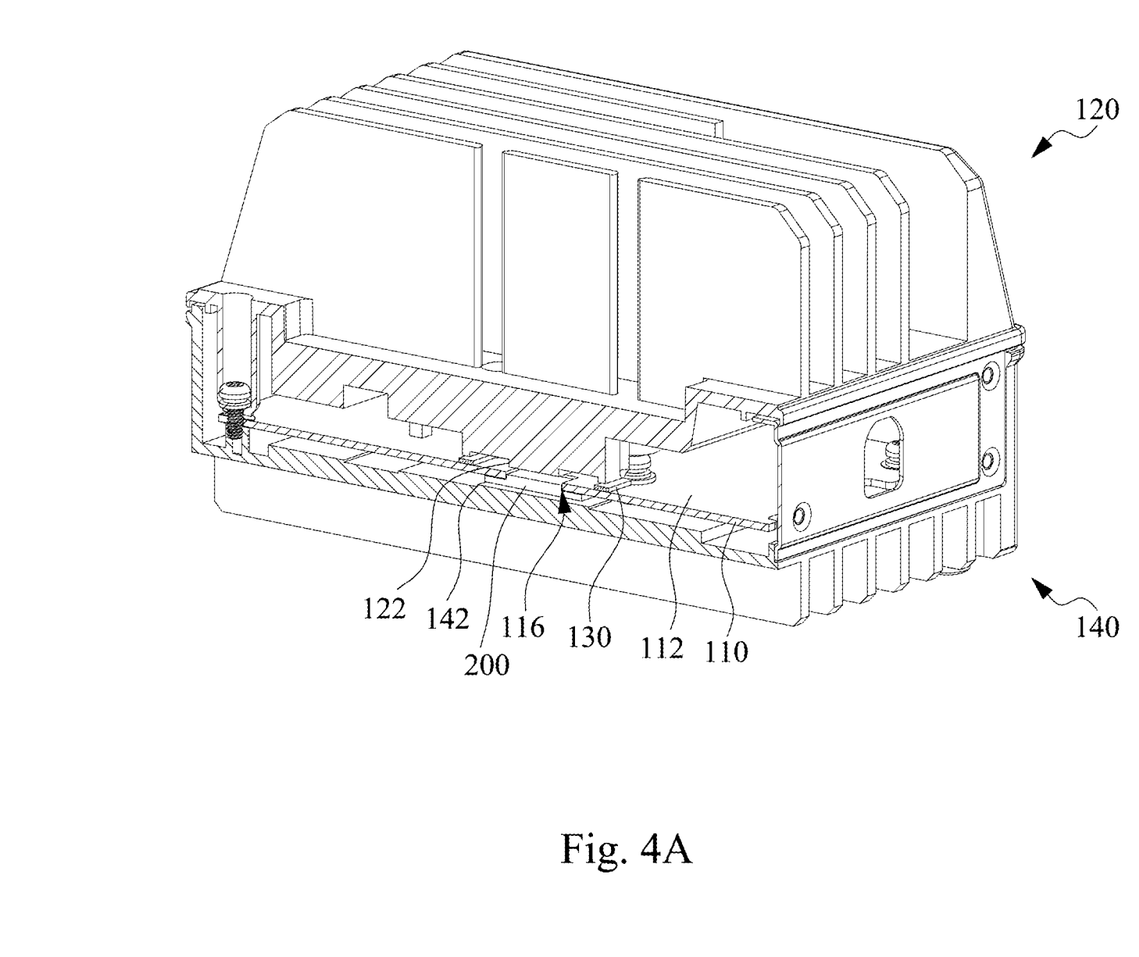
FIG. 4A schematically illustrates a 3D sectional view of the fixing device along line 4-4 in FIG. 1, according to some embodiments of the present disclosure.
Figure 4B:
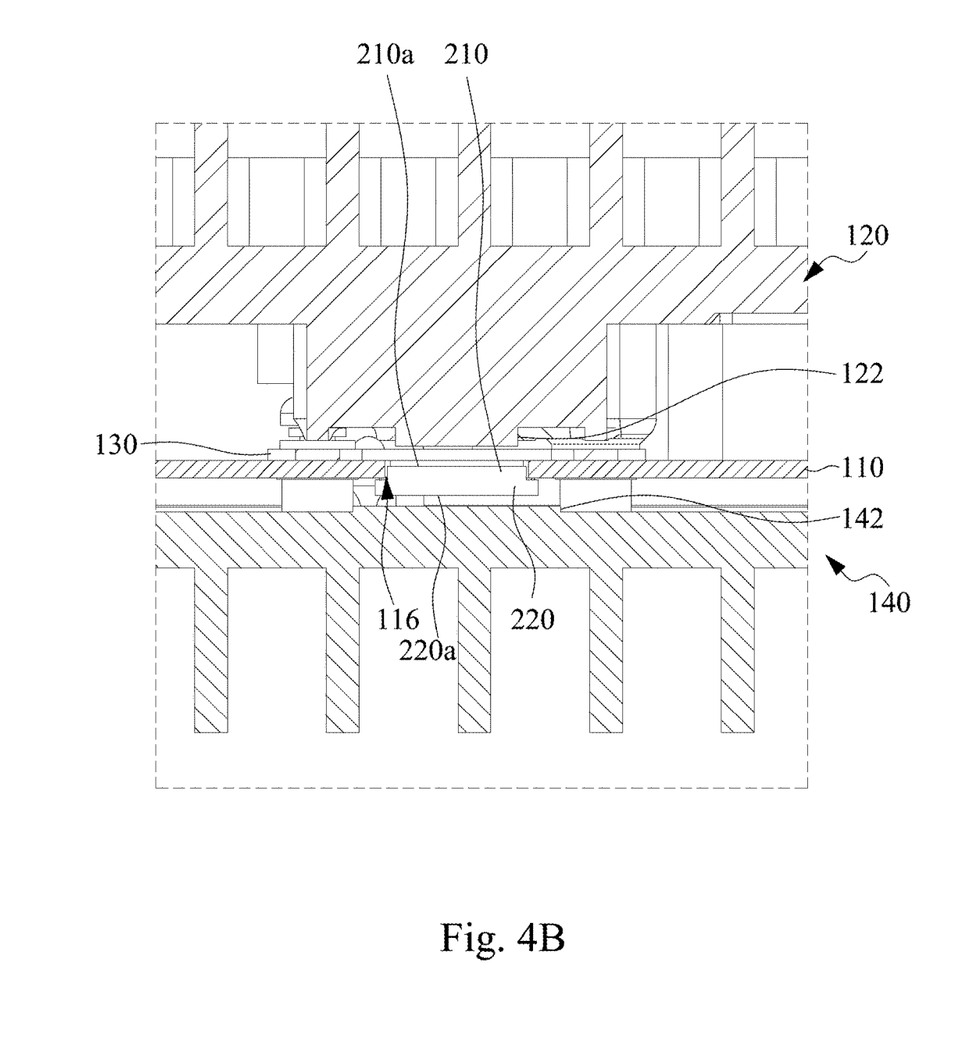
FIG. 4B is a sectional enlarged view of a part of the fixing device in FIG. 4A.

FIG. 4A schematically illustrates a 3D sectional view of the fixing device 100 along line 4-4 in FIG. 1, according to some embodiments of the present disclosure. FIG. 4B is a sectional enlarged view of a part of the fixing device 100 in FIG. 4A. In the embodiment shown in FIG. 3, FIG. 4A and FIG. 4B, the circuit board 110 is located between the first cover 120 and the second cover 140, and a part of the double-layer chip 200 (e.g., the upper layer 210 of the double-layer chip 200) is contained inside the opening 116. The reinforcing piece 130 on the first surface 112 of the circuit board 110 is located between the first cover 120 and the circuit board 110. The first abutting surface 122a penetrates through the reinforcing piece 130 and partially extends into the opening 116 and contacts the upper surface 210a of the double-layer chip 200. The second abutting surface 142a contacts the lower surface 220a of the double-layer chip 200. The lower layer 220 of the double-layer chip 200 is also electrically connected to the circuit board 110 through the solder balls. A thermal paste may be applied between the double-layer chip 200, the first bump 122 and the second bump 142 to assist heat conduction between the first bump 122 and the second bump 142. As a result, the double-layer chip 200 may overcome the problem of cracking or deformation caused by uneven force distribution, and at the same time, a good dissipation efficiency may be maintained to ensure continued normal operation of the double-layer chip 200.

In some embodiments, the reinforcing piece 130 further includes the fixing portions 132, as described above. At least one of the fixing portions 132 is fixed to the first cover 120, and at least another one of the fixing portions 132 is fixed to the second cover 140. Specifically, the reinforcing piece 130 in FIG. 3 has four fixing portions 132 which are located on four corners of the reinforcing piece 130 (which is a rectangular frame in this embodiment). The fixing portions 132 are separated into two groups. The two fixing portions 132 on the same diagonal line are in the same group. One of the groups of the fixing portions 132 is fixed on the first cover 120, while the other group of the fixing portions 132 is fixed on the second cover 140. The purpose of separating the fixing portions 132 into two groups is to equally distribute the force applied on the reinforcing piece 130 by the first cover 120 and the second cover 140. Compared to fixing all of the fixing portions 132 of the reinforcing piece 130 on the first cover 120 or the second cover 140, separating the fixing portions 132 may function to more equally distribute force on the reinforcing piece 130.

According to the above paragraphs, in the fixing device of the present disclosure, the reinforcing piece on the surface of the circuit board, which is located between the first cover and the second cover, improves the equal distribution of force that applies from different directions. The reinforcing piece further strengthens the area that surrounds the opening of the circuit board, and disperses the force applied around the opening. Moreover, together with the first bump and the second bump, the reinforcing piece separates the force applied to the chip contained inside the opening to two opposite sides of the chip. Therefore, the circuit board or the electrical components or chips on the circuit board are prevented from being cracked or deformed by the force. In addition, the fixing device further solves the heat dissipation problem of the circuit board by conducting the heat to the cooling fins by the first bump and the second bump.

In one embodiment in the present disclosure, the present device may be used for artificial intelligence (AI) computing, edge computing, and also may be used for a 5G server, cloud server or car network server.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A fixing device, comprising:
   a circuit board having a first surface and a second surface that are opposite to each other and comprising an opening that penetrates through the first surface and the second surface;
   a first cover disposed adjacent to the first surface, wherein the first cover has a first bump, and the first bump has a first abutting surface facing the first surface;
   a second cover comprising a second bump and a plurality of heat dissipation structures, wherein the second bump has a second abutting surface that corresponds in location to the opening, and the plurality of heat dissipation structures comprise cooling fins;
   a reinforcing piece disposed on the first surface and adjacent to the first bump and comprising a plurality of fixing portions, wherein at least one of the fixing portions on the same diagonal line is fixed to the first cover, and at least another one of the fixing portions on the same diagonal line is fixed to the second cover;
   a double-layer chip having an upper layer and a lower layer, the upper layer and the lower layer being electrically connected, wherein an upper surface of the upper layer and a lower surface of the lower layer are respectively located on opposite sides of the double-layer chip, an area of the upper surface is smaller than an area of the lower surface, and the lower layer of the double-layer chip is electrically connected to the second surface of the circuit board; and
   wherein the first abutting surface contacts the upper layer of the double-layer chip, the second abutting surface contacts the lower layer of the double-layer chip, and the circuit board is disposed between the first cover and the second cover.

2. The fixing device of claim 1, wherein the reinforcing piece is fully attached on the first surface.

3. The fixing device of claim 1, wherein the reinforcing piece comprises two fixing portions that contact and fix to the first surface, and the first bump is disposed between the two fixing portions of the reinforcing piece.

4. The fixing device of claim 1, wherein the opening corresponds in location to the first bump, and the upper layer of the double-layer chip is embedded into the opening.

5. The fixing device of claim 4, wherein the reinforcing piece is a closed frame that surrounds the opening.

6. The fixing device of claim 4, wherein a projection of the first abutting surface along a direction that is perpendicular to the first surface passes through the opening and is located inside an inner edge of the opening.

7. The fixing device of claim 6, wherein the first abutting surface partially protrudes into the opening.

8. The fixing device of claim 1, wherein the first bump and the second bump comprise thermal conductive material.

* * * * *